United States Patent
Krumrey et al.

(10) Patent No.: US 6,891,223 B2
(45) Date of Patent: May 10, 2005

(54) TRANSISTOR CONFIGURATION WITH A STRUCTURE FOR MAKING ELECTRICAL CONTACT WITH ELECTRODES OF A TRENCH TRANSISTOR CELL

(75) Inventors: Joachim Krumrey, München (DE); Franz Hirler, Isen (DE); Ralf Henninger, München (DE); Martin Pölzl, Ossiach (AT); Walter Rieger, Arnoldstein (AT)

(73) Assignee: Infineon Technologies AG, Munich (DE)

( * ) Notice: Subject to any disclaimer, the term of this patent is extended or adjusted under 35 U.S.C. 154(b) by 170 days.

(21) Appl. No.: 10/392,025

(22) Filed: Mar. 19, 2003

(65) Prior Publication Data

US 2003/0222297 A1 Dec. 4, 2003

(30) Foreign Application Priority Data

Mar. 19, 2002 (DE) .......................................... 102 12 144

(51) Int. Cl.$^7$ .............................................. H01L 29/76
(52) U.S. Cl. ....................... 257/330; 257/331; 257/340; 257/341; 257/386; 257/659
(58) Field of Search ................................. 257/330, 331, 257/340, 341, 386

(56) References Cited

U.S. PATENT DOCUMENTS

| 5,283,201 | A | | 2/1994 | Tsang et al. |
| 6,150,675 | A | | 11/2000 | Franke et al. |
| 6,580,123 | B2 | * | 6/2003 | Thapar ....................... 257/330 |
| 6,690,062 | B2 | * | 2/2004 | Henninger et al. ......... 257/340 |

* cited by examiner

*Primary Examiner*—Gene M. Munson
(74) *Attorney, Agent, or Firm*—Laurence A. Greenberg; Werner H. Stemer; Ralph E. Locher

(57) ABSTRACT

Transistor configurations have trench transistor cells disposed along trenches in a semiconductor substrate with two or more electrode structures disposed in the trenches, and also metallizations are disposed above a substrate surface of the semiconductor substrate. The trenches extend into an inactive edge region of the transistor configuration and an electrically conductive connection between the electrode structures and corresponding metallizations are provided in the edge region.

16 Claims, 3 Drawing Sheets

TRANSISTOR CONFIGURATION WITH A STRUCTURE FOR MAKING ELECTRICAL CONTACT WITH ELECTRODES OF A TRENCH TRANSISTOR CELL

BACKGROUND OF THE INVENTION

Field of the Invention

The invention relates to a transistor configuration with a structure for making electrical contact with two or more electrodes of a trench transistor cell which are disposed in trenches.

Transistor configurations fashioned as MOS power transistors are used for controlling switching currents with high current intensities (up to tens of amperes) by low control voltages, the dielectric strength of which transistor configurations in the switched load circuit may amount to up to hundreds of volts and the switching times of which transistor configurations are usually in the region of a few microseconds.

MOS power transistors are present for example as trench MOS power transistors. A trench MOS power transistor usually contains a semiconductor substrate which has in each case a plurality of trench transistor cells disposed one beside the other in at least one active cell array.

Depending on the fashioning of the trench transistor cells, it is possible to realize, for example, normally on and normally off p-channel or n-channel trench MOS power transistors.

As the current intensity rises between a source zone and a drain zone, the temperature of the semiconductor body increases and the mobility of the charge carriers in the channel zone decreases. This effect results in that trench transistor cells can be electrically connected in parallel in a simple manner. If, by way of example, in the activated state, initially a somewhat higher current flows through one of the trench transistor cells connected in parallel, then this leads to a relatively greater increase in temperature in the trench transistor cell. On account of the increased temperature, the mobility of the charge carriers in the channel is reduced and the trench transistor cell thus acquires a higher impedance. Consequently, the current is distributed between cooler trench transistor cells connected in parallel.

In the semiconductor substrate of a trench MOS power transistor, a trench transistor cell is usually fashioned along an elongate trench or defined by a polygon-like trench. It is possible, then, for a plurality of the trenches to be disposed one beside the other to form an active cell array, the gate electrodes in adjacent trenches also being able to be electrically connected to one another via transverse trenches.

The maximum current intensity which can be switched by a trench MOS power transistor is determined by the drain-source resistance ($R_{DS(ON)}$) of the trench transistor cells connected in parallel. The minimum switching time and the maximum operating frequency are essentially determined by the gate parameters of input resistance ($R_G$), gate charge ($Q_G$) and input capacitance ($C_{ISS}$).

The input resistance is determined substantially by the resistance of the gate electrodes in the trenches and to a small extent by the resistance of the connecting lines between a gate terminal of the trench MOS power transistor and the gate electrodes in the trenches. The input capacitance $C_{ISS}$ results from addition of the gate-source capacitance ($C_{GS}$) and the gate-drain capacitance ($C_{GD}$).

International Patent Disclosure WO 98/02925 discloses a MOS power transistor having a gate electrode disposed above the substrate surface in a planar manner, in which the switching times and switching losses are reduced by reduction of the gate-drain capacitance $C_{GD}$. In this case, a field electrode that is electrically conductively connected to the source terminal of the MOS power transistor is disposed in each case beside the gate electrode. The field electrode shields the electrical charge on the gate electrode from the drift zone and reduces the area at which the gate electrodes and the drift zone are opposite one another.

A further concept for reducing the gate-drain capacitance is disclosed in U.S. Pat. No. 5,283,201. In this case, in a trench transistor cell having a gate electrode disposed in a trench in the semiconductor substrate, an auxiliary electrode made of the material of the gate electrode is disposed below the gate electrode and is electrically insulated from the latter.

Generally, for MOS power transistors the emphasis is on seeking to further reduce the gate-drain capacitance $C_{GD}$ in order to improve the functionality and in order to extend the range of application of MOS power transistors, for instance for higher operating frequencies.

SUMMARY OF THE INVENTION

It is accordingly an object of the invention to provide a transistor configuration with a structure for making electrical contact with electrodes of a trench transistor cell that overcomes the above-mentioned disadvantages of the prior art devices of this general type, in the case of which a gate-drain capacitance of the transistor configuration is reduced compared with conventional transistor configurations, with the functionality being preserved at the same time.

With the foregoing and other objects in view there is provided, in accordance with the invention, a transistor configuration. The transistor configuration has at least one gate terminal, at least one source terminal, at least one drain terminal, a semiconductor substrate having a substrate surface, and at least one active cell array formed in the semiconductor substrate. The semiconductor substrate has at least one trench within the active cell array. An edge region adjoins the active cell array and the trench extends into the edge region. At least one trench transistor cell is formed along the trench. At least two electrode structures are disposed within the trench and extend along the trench. Metallizations are disposed substantially above the substrate surface of the semiconductor substrate. At least one of the two electrode structures is electrically conductively connected to one of the metallizations in the edge region.

Such a transistor configuration of the type according to the invention connects at least two electrode structures disposed one beside the other and/or one above the other in the trench of the trench transistor cell to terminal metallizations of the transistor configuration in a manner that is particularly advantageous since it saves space and exhibits topologic convenience. As a result, the functionality is maintained for the same extent (chip area) of the transistor configuration.

The transistor configuration according to the invention is preferably fashioned as a trench MOS power transistor with a field electrode. In this case, a plurality of trench transistor cells are disposed and electrically connected in parallel in a respective cell array. In the trenches of the trench transistor cells, a field electrode is in each case disposed below or beside the gate electrode. The trench MOS power transistor has a source metallization connected to a source terminal, and a gate metallization connected to a gate terminal, the gate metallization being electrically conductively connected to the upper electrode structures (gate electrodes).

The configuration and fashioning of the electrical connections in each case between the gate metallization and the gate electrode, and between the lower electrode structure (field electrode) and a field metallization, enable a highly advantageous configuration and fashioning of the source and gate metallizations above a substrate surface of the semiconductor substrate.

Thus, the source metallization is advantageously disposed at least in parts above the active cell array and is surrounded at least in sections by the gate metallization.

As a result, first, the contact connection of source zones disposed in the cell array has very low impedance, and, second, patterning of the source metallization is unnecessary. Such patterning of the source metallization, which has a thickness of a number of micrometers, is complicated in terms of production technology since, for instance during a wet etching, the source metallization is undercut approximately in the order of magnitude of the thickness of the source metallization.

The electrical connections for instance between the gate or field electrodes disposed one above the other and the corresponding metallizations can be realized in various ways, for instance by plated-through holes from the metallization to the electrode structure respectively provided in the trench. Such configurations are advantageous when the dimensions of the trenches and of the plated-through holes permit the plated-through holes to be positioned relative to the trenches without difficulty.

In an advantageous fashioning of the trench MOS power transistor according to the invention, the two electrode structures in the trench are directly connected via plated-through holes to corresponding metallizations that are preferably disposed in the edge region section by section above the trenches. By virtue of the plated-through holes to the field electrode, the gate electrode disposed above the latter is interrupted in the regions of the plated-through holes in the trench. The interruptions are bridged by a suitable configuration of transverse trenches by which at least the gate electrodes of adjacent trench transistor cells are electrically conductively connected. In this way, advantageously, there is no need for an additional photolithographic process for shaping a field structure, for instance.

In a further embodiment of the trench MOS power transistor according to the invention, the gate electrode is electrically conductively connected to the gate metallization via a gate structure above the substrate surface and the field electrode is electrically conductively connected to the field metallization directly via plated-through holes. Transverse trenches that electrically conductively connect the gate electrodes of adjacent trench transistor cells are again necessary in this case.

In this case, the gate structure and the gate electrodes contain the same material and emerge from the same process step in terms of production technology, in this case, for example after the deposition of the material of the gate electrode, before the material is etched back to at least below the substrate surface, for the purpose of shaping the gate electrode, all that is necessary is a non-critical, etching-resistant masking of the gate structure.

In a further advantageous fashioning, the trench MOS power transistor according to the invention has a field structure above the substrate surface, which imparts an electrically conductive connection between the field electrode and the field metallization, and also a gate metallization, which extends section by section, for instance in the edge region, above the trenches, and also plated-through holes which electrically conductively connect the gate metallization directly to the gate electrodes in the trenches. This obviates a masking of gate structures before the etching back of the deposited material of the gate electrode.

Furthermore, a fashioning of the field electrodes in the trenches made of a deposited material of the field electrode (field polysilicon) can be realized in a single controllable etching-back step.

To that end, first the field structures that emerge from the field polysilicon are covered and the field polysilicon is subsequently etched back. An uncovering of a field oxide that covers the substrate outside the trenches is detected during the etching back of the field polysilicon. The further etching process can be synchronized to the detected signal. The remaining etching duration and etching rate yield a filling height up to which the field electrodes fashioned in this way fill the trenches. In this way, the filling height can be adjusted to a channel zone/drift zone junction that is fashioned later in the semiconductor substrate. In the case of configurations in which the field electrode is electrically connected by through-plating, by contrast, the field polysilicon is made to recede to just below the substrate surface in a first step and is then covered in regions provided for contact connection. In the active cell array, the field electrodes are etched back further. In this case, a signal by which the etching process can be synchronized cannot be generated in a simple manner.

In accordance with a particularly preferred embodiment of the invention, the gate electrode is fashioned in a shortened manner in the edge region in the trench, so that the trenches are only filled by the field electrode at their ends. In this case, the gate structure is disposed in such a way that the gate electrode, which is contact-connected toward the cell array, is electrically conductively connected to a gate metallization which is remote from the cell array, and the field electrode, which is contact-connected in a manner remote from the cell array, is electrically conductively connected to a field metallization oriented toward the cell array.

In a preferred manner, the gate structure and the field structures on the substrate surface are electrically insulated from one another and from the semiconductor substrate by insulator layers and are fashioned one beside the other in a common layer plane. This results in an advantageous planar construction of the gate and field structures, and in non-critical field conditions.

Furthermore, in a preferred manner, the gate structure is disposed at least in sections above the field structures, the gate structure being electrically insulated from this by an intermediate oxide layer. Such a configuration yields, as a result of the non-interrupted extensive gate structure, a low non-reactive resistance in the connection between the gate terminal and the gate electrodes. Furthermore, the field structures disposed between the drain potential and the gate structure advantageously shield the drift layer from the gate structure.

In a further preferred embodiment, the transistor configuration according to the invention has an additional electrical terminal which is electrically conductively connected to the field metallization and at which a further potential can be fed to the transistor configuration besides the source, gate and drain potentials and by which the field electrode can be controlled particularly effectively. As an alternative to this, the field metallization is connected to a circuit section of the trench MOS power transistor that can control such a potential.

In a particularly preferred embodiment, the field metallization is identical to the source metallization or is electrically conductively connected thereto. By controlling the potential of the field electrode with the source potential, the field electrode can be effectively controlled in a very simple and uncomplicated manner.

In the text above, the invention has been explained in each case using the example of a trench transistor cell. The invention can furthermore be extended in an obvious manner to IGBTs and those with a drain-up structure. Furthermore, the invention can be applied in each case to normally on and normally off p-channel and n-channel transistor cells.

Other features which are considered as characteristic for the invention are set forth in the appended claims.

Although the invention is illustrated and described herein as embodied in a transistor configuration with a structure for making electrical contact with electrodes of a trench transistor cell, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
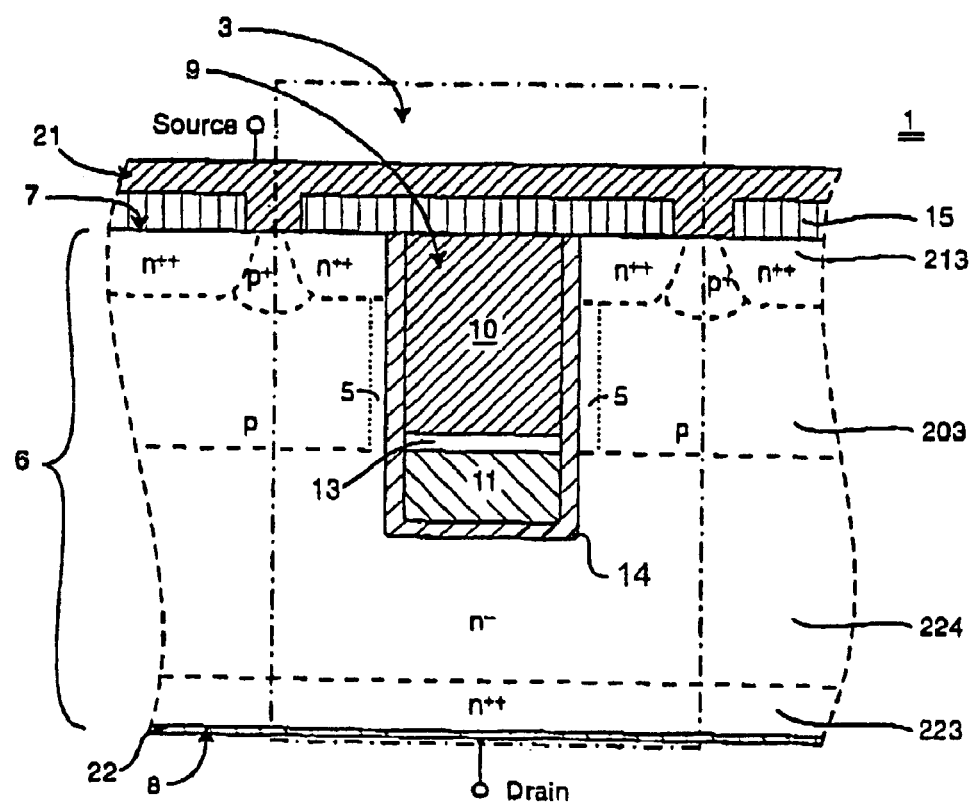
FIG. 2 is a simplified diagrammatic cross-sectional view through a trench transistor cell of a simple type according to the prior art.

Referring now to the figures of the drawing in detail and first, particularly, to FIG. 2 thereof, there is shown a cross-sectional view of an individual conventional trench transistor cell 3 of a normally off n-channel trench MOS power transistor 1. In this example, a heavily n-doped ($n^{++}$-doped) drain zone 223 is formed in a semiconductor substrate 6. Furthermore, a weakly n-doped (n-doped) drift zone 224, which emerged from an epitaxial process, is disposed on the drain zone 223.

The drift zone 224 is adjoined by a first p-doped diffusion region and a second, $n^{++}$-doped diffusion region. In this case, the p-doped diffusion regions form channel zones 203 and the $n^{++}$-doped diffusion regions form source zones 213 of the trench transistor cell 3. A trench 9 is provided in the diffusion regions. A trench wall is lined with a gate oxide 14 that electrically insulates a trench interior from the surrounding semiconductor substrate 6. Moreover, the trench 9 is filled with a conductive polysilicon that forms a gate electrode 10.

Above the trench 9, a gate metallization is disposed in an edge region adjoining the gate electrode 10 on the substrate surface 7. A source metallization 21 is applied on the substrate surface 7 and makes electrical contact with the source zones 213 and the channel zones 203. The source metallization 21 and the gate metallization are electrically insulated from one another and from the semiconductor substrate 6 by an intermediate oxide layer 16. On a substrate rear side 8 opposite to the substrate surface 7 of the semiconductor substrate 6, a drain metallization 22 is disposed adjoining the drain zone 223 of the semiconductor substrate 6.

In the voltage-free state, the conductive source zones 213 are electrically insulated from the drain zone 223 by the p-doped channel zones 203. If the gate electrode 10 is biased with a positive potential, then minority carriers, in this case electrons, accumulate in the channel zone 203, directly adjoining the gate oxide 14.

As the positive bias of the gate electrode 10 rises, an n-conducting channel 5 forms in the originally p-conducting channel zone 203 (inversion).

As the current intensity rises between the source zone 213 and the drain zone 223, the temperature of the semiconductor body increases and the mobility of the charge carriers in the channel zone 203 decreases. This effect results in that trench transistor cells can be electrically connected in parallel in a simple manner. If, by way of example, in the activated state, initially a somewhat higher current flows through one of the trench transistor cells connected in parallel, then this leads to a relatively greater increase in temperature in the trench transistor cell. On account of the increased temperature, the mobility of the charge carriers in the channel is reduced and the trench transistor cell thus acquires a higher impedance. Consequently, the current is distributed between cooler trench transistor cells connected in parallel.

In the semiconductor substrate of the trench MOS power transistor, the trench transistor cell is usually fashioned along an elongate trench or defined by a polygon-like trench. In the manner described above, it is possible, then, for a plurality of the trenches to be disposed one beside the other to form an active cell array, the gate electrodes in adjacent trenches also being able to be electrically connected to one another via transverse trenches.

The maximum current intensity which can be switched by a trench MOS power transistor is determined by the drain-source resistance ($R_{DS(ON)}$) of the trench transistor cells connected in parallel. The minimum switching time and the maximum operating frequency are essentially determined by the gate parameters of input resistance ($R_G$), gate charge ($Q_G$) and input capacitance ($C_{ISS}$).

The input resistance is determined substantially by the resistance of the gate electrodes in the trenches and to a small extent by the resistance of the connecting lines between a gate terminal of the trench MOS power transistor and the gate electrodes in the trenches. The input capacitance ($C_{ISS}$) results from addition of the gate-source capacitance ($C_{GS}$) and the gate-drain capacitance ($C_{GD}$).

A configuration for trench transistor cells as is known from FIG. 2 has a high capacitance between the gate electrodes 10 and the drift zone 224 assigned to the drain terminal. It results from the fact that the drift zone 224 and the gate electrodes 10 are opposite one another at the thin gate oxide 14.

Figure 1A:
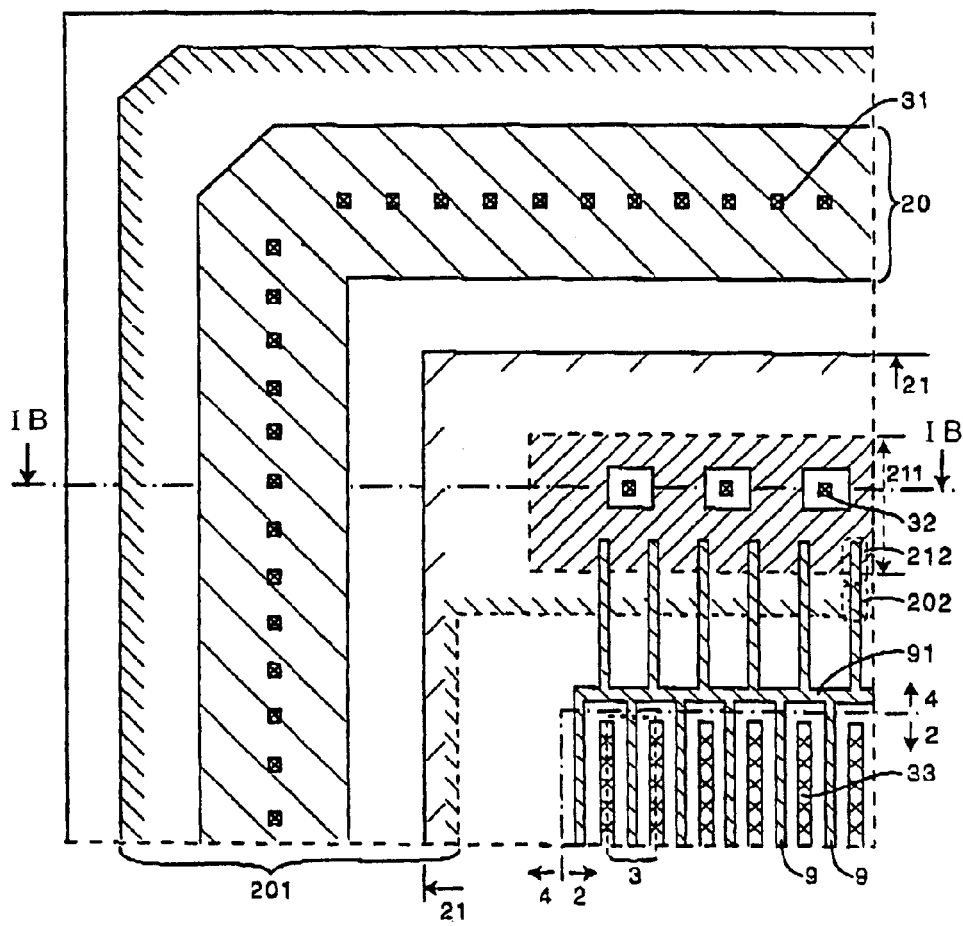
FIG. 1A is a simplified diagrammatic plan view of a detail of trench MOS power transistor in accordance with a first exemplary embodiment of the invention.

FIG. 1A is a plan view illustrating a detail of a trench MOS power transistor according to the invention and continues from the prior art as illustrate in FIG. 2. In this case, an active cell array 2 is adjoined by an edge region 4. The active cell array 2 has a plurality of the trench transistor cells 3 disposed along parallel trenches 9.

The trenches 9 are lengthened into the edge region 4, in this example the electrode structures 10, 11 disposed in the trenches 9 are electrically conductively connected to one another by transverse trenches 91. During the fashioning of the connections between the trenches 9 and the transverse trenches 91, crossovers are avoided in a known manner and T structures, which are less critical in terms of process technology, are realized in place thereof.

In the edge region 4, the trenches 9 have first opened sections 212, in which the upper electrode structure 10 (gate electrode) is made to recede in the trenches 9 and in which the lower electrode structure 11 (field electrode) fills the trenches 9 up to the substrate surface 7 without insulator layers bearing on it.

Furthermore, the trenches 9 have, in the edge region 4, second opened sections 202, in which the gate electrode 10 is in each case present up to the substrate surface 7 without an insulator layer bearing on it.

A field structure, fashioned as a source structure 211 in this example, made of the same conductive semiconductor material as the field electrode 11 bears on the first opened sections 212 of the trenches 9. The source structure 211 is thus electrically conductively connected to the field electrodes 11. In this case, the source structure 211 and the field electrode 11 emerge from a single deposited layer of the conductive semiconductor material, for instance by etching back.

A gate structure 201 extends over the second opened sections 202. The respective gate electrodes 10 are thus electrically conductively connected to the gate structure 201. The gate structure 201 and the gate electrode 10 also emerge from a single deposited layer of the conductive semiconductor material, for instance by etching back. The gate structure 201 furthermore extends over the source structure 211, the gate structure 201 and the source structure 211 are electrically insulated from one another by an insulator layer 16. The intermediate oxide layer 16 bears on the gate structure 201 at least in sections.

Disposed above sections of the gate structure 201 is a gate metallization 20 that is electrically conductively connected to the gate structure 201 by plated-through holes 31 through the intermediate oxide layer 16.

A field metallization, fashioned as a source metallization 21 in this example, bears in the region of the active cell array 2 and in sections of the edge region 4. The source metallization 21 is connected to source zones of the trench transistor cells 3 via plated-through holes 33 in the active cell array 2. In the edge region 4, the source metallization 21 is electrically conductively connected to the source structure 211 via plated-through holes 32.

Figure 1B:
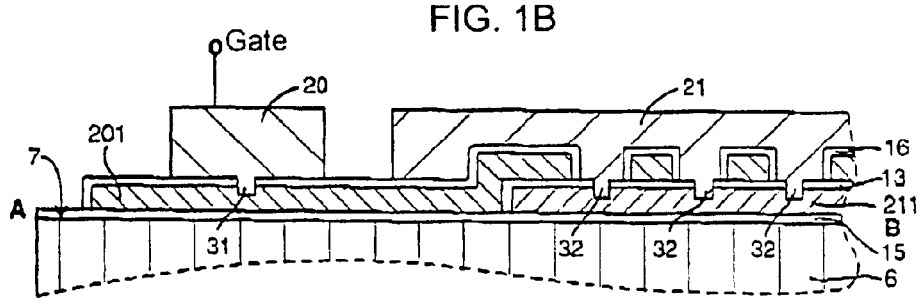
FIG. 1B is a diagrammatic cross-sectional view of the trench MOS power transistor taken along the line IB—IB shown in FIG. 1A.

FIG. 1B shows a diagrammatic cross-sectional view taken along the line IB—IB shown in FIG. 1A of the trench MOS power transistor 1.

In comparison with FIG. 1A, FIG. 1B additionally reveals a field oxide layer 15, which electrically insulates the semiconductor substrate 6 from the structures 201, 211 disposed above the substrate surface 7. Furthermore, FIG. 1B shows the vertical configuration of the source structure 211, of the gate structure 201 bearing in sections on the source structure 211, of the metallizations 20, 21, and of the insulator layers 15, 16. In this case, the illustration of the insulator layers 15, 16, in particular, is greatly simplified.

Thus, each insulator layer 15, 16 can be embodied as a multilayer system. The fashioning of the insulator layers 15, 16 at junctions is dependent on the type of fabrication, for instance a deposition or an oxidation. Equally, the gate and field electrodes 10, 11, and also the gate and field structures 201, 211 can be reinforced with silicide or metal or be composed entirely of silicide, metal or other highly conductive materials.

Figure 3A:
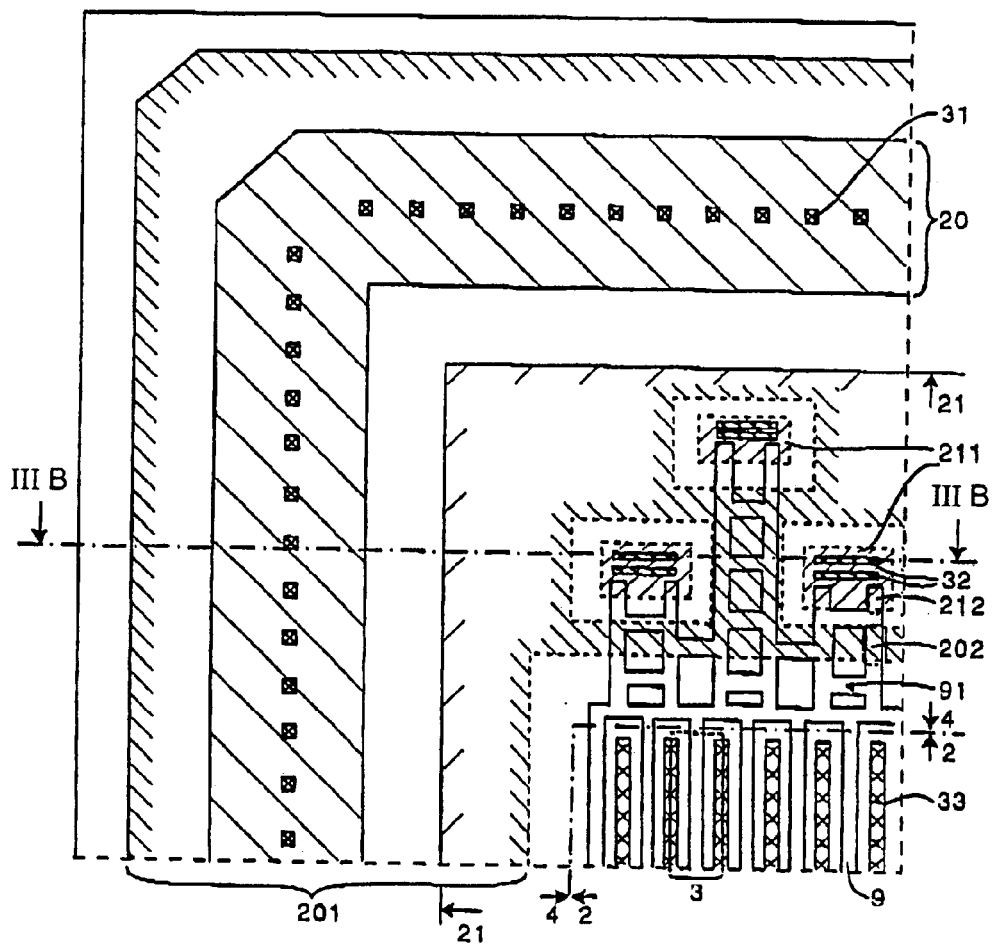
FIG. 3A is a simplified diagrammatic plan view of a detail of the trench MOS power transistor in accordance with a second exemplary embodiment according to the invention.

FIG. 3A illustrates a plan view of a second embodiment of a detail of the trench MOS power transistor.

In contrast to the embodiment illustrated in FIGS. 1A and 1B, the gate structure 201 is disposed exclusively beside the source structure 211. A mutually offset configuration of individual source structures 211 results in a mesh-like fashioning of the gate structure 201 in the region of the source structures 211. The mesh-like fashioning of the gate structure 201 advantageously brings about a uniform potential distribution in the gate structure 201 during operation of the trench MOS power transistor.

Figure 3B:
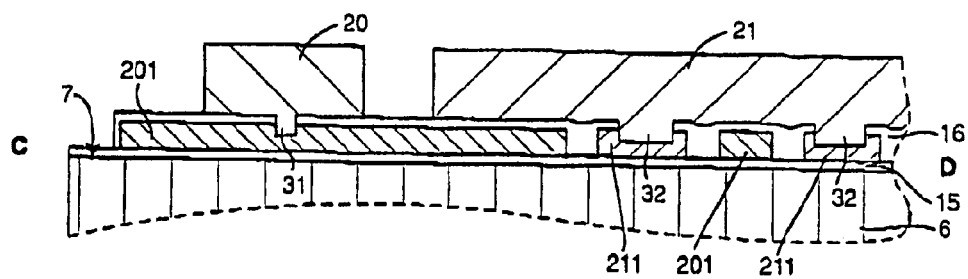
FIG. 3B is a sectional view of the trench MOS power transistor taken along the line IIIB—IIIB shown in FIG. 3A.

FIG. 3B shows a diagrammatic cross-sectional view through the detail—illustrated in FIG. 3A—of the trench MOS power transistor 1 taken along the line IIIB—IIIB shown in FIG. 3A.

Accordingly, the gate structures 201 and the source structures 211 are disposed one beside the other above the substrate surface 7 of the semiconductor substrate 6 thereby producing an advantageous planar topography of the field structures 201, 211 and of the metallizations 20, 21.

We claim:

1. A transistor configuration, comprising:
    at least one gate terminal;
    at least one source terminal;
    at least one drain terminal;
    a semiconductor substrate having a substrate surface;
    at least one active cell array formed in said semiconductor substrate, said semiconductor substrate having at least one trench formed therein within said active cell array
    an edge region adjoining said active cell array and said trench extending into said edge region;
    at least one trench transistor cell formed along said trench;
    at least two electrode structures disposed within said trench and extending along said trench; and
    metallizations disposed substantially above said substrate surface of said semiconductor substrate, at least one of said two electrode structures electrically conductively connected to one of said metallizations in said edge region.

2. The transistor configuration according to claim 1, further comprising an insulation disposed in said trench, said at least two electrode structures include a first electrode structure and a second electrode structure disposed in said trench, said electrode structures are disposed at least one of besides one another and one above the other and are electrically insulated from one another and from said semiconductor substrate by said insulation, said electrode structures are each electrically conductively connected to a corresponding one of said metallizations.

3. The transistor configuration according to claim 2, wherein:
    said trench is one of a plurality of trenches formed in said semiconductor substrate;
    said trench transistor cell is one of a plurality of trench transistor cells disposed in said trenches, in each said trench, said first electrode structure is a gate electrode and said second electrode structure is a field electrode, said field electrode substantially disposed below said gate electrode.

4. The transistor configuration according to claim 1, wherein the transistor configuration is a trench MOS power transistor, said metallizations include at least one gate metallization electrically conductively connected to said gate terminal, a source metallization electrically conductively connected to said source terminal, and a drain metallization electrically conductively connected to said drain terminal, said gate metallization at least partly surrounding said source metallization which is substantially disposed above said active cell array.

5. The transistor configuration according to claim 1, wherein:
said semiconductor substrate has transverse trenches formed therein, said gate electrode of each of said trench transistor cells of said active cell array are electrically conductively connected to one another through said transverse trenches;
said trenches have first sections and second sections; and
one of said metallizations is a field metallization, and at least one part of said field metallization is disposed in said edge region above said first section of said trenches, said field metallization having at least one plated-through hole electrically conductively connecting said field electrode to said field metallization.

6. The transistor configuration according to claim 1, wherein another one of said metallizations is a gate metallization, at least one part of said gate metallization is disposed in said edge region above said second section of said trenches and has at least one further plated through hole electrically conductively connecting said gate electrode to said gate metallization.

7. The transistor configuration according to claim 1, wherein said gate electrode extends out into said edge region and into said second sections over said substrate surface and forms a gate structure above said substrate surface, and at least one part of said gate metallization is disposed in said edge region section by section above said gate structure and is electrically conductively connected to said gate structure by a plurality of said further plated-through hole.

8. The transistor configuration according to claim 1, wherein:
said trench has a first section and a second section; and
one of said two electrode structures is a field electrode extending into said edge region and into said first section over said substrate surface and forms a field structure above said substrate surface; and
one of said metallizations is a field metallization and at least one part of said field metallization is disposed in said edge region section by section above said field structure and has a plurality of plated-through holes electrically conductively connecting said field structure to said field metallization.

9. The transistor configuration according to claim 8, wherein:
one of said two electrode structures is a gate electrode; and
another one of said metallizations is a gate metallization and at least one part of said gate metallization is disposed in said edge region above said second section of said trench, said gate metallization has at least one further plated-through hole electrically conductively connecting said gate electrode to said gate metallization.

10. The transistor configuration according to claim 8, wherein:
one of said electrode structures is a gate electrode extending out into said edge region and into said second section over said substrate surface (7) and forms a gate structure above said substrate surface; and
another one of said metallizations is a gate metallization and at least one part of said gate metallization is disposed in said edge region section by section above said gate structure, said gate metallization having a plurality of further plated-through holes electrically conductively connecting said gate structure to said gate metallization.

11. The transistor configuration according to claim 10, wherein said field structure is one of a plurality of field structures, said gate structure and said field structures are fashioned exclusively in a common plane, said gate structure at least partly surrounding said field structures.

12. The transistor configuration according to claim 10, wherein said field structure is one of a plurality of field structures, said field structures are covered at least in sections by said gate structure in a second layer.

13. The transistor configuration according to claim 1, further comprising a field terminal electrically conductively connected to one of said metallizations being a field metallization.

14. The transistor configuration according to claim 1, wherein said field metallization is a source metallization.

15. The transistor configuration according to claim 1, wherein said gate electrode and said gate structure emerged from an identical layer.

16. The transistor configuration according to claim 1, wherein said field electrode and said field structure emerged from an identical layer.

* * * * *